United States Patent
Takeoka et al.

(10) Patent No.: US 8,941,552 B2
(45) Date of Patent: Jan. 27, 2015

(54) COMPOSITE PRINTED WIRING BOARD AND WIRELESS COMMUNICATION SYSTEM

(75) Inventors: Makoto Takeoka, Nagaokakyo (JP); Koji Shiroki, Nagaokakyo (JP); Nobuo Ikemoto, Nagaokakyo (JP); Yuya Dokai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 390 days.

(21) Appl. No.: 13/572,722

(22) Filed: Aug. 13, 2012

(65) Prior Publication Data

US 2012/0306719 A1    Dec. 6, 2012

Related U.S. Application Data

(63) Continuation of application No. PCT/JP2011/051424, filed on Jan. 26, 2011.

(30) Foreign Application Priority Data

Feb. 19, 2010  (JP) .................................. 2010-034738

(51) Int. Cl.
   *H01Q 7/00*   (2006.01)
   *G06K 19/077* (2006.01)
   *H05K 1/14*   (2006.01)
   *H01Q 1/22*   (2006.01)
   *H01Q 1/38*   (2006.01)
   *H01Q 23/00*  (2006.01)
   *H05K 3/34*   (2006.01)

(52) U.S. Cl.
   CPC .......... *G06K 19/07749* (2013.01); *H05K 1/141* (2013.01); *H01Q 1/2208* (2013.01); *H01Q 1/38* (2013.01); *H01Q 23/00* (2013.01); *H05K 3/3436* (2013.01); *H05K 2201/09481* (2013.01); *H05K 2201/10098* (2013.01)
   USPC .......................................... 343/866; 343/702

(58) Field of Classification Search
   USPC .......................... 343/702, 866, 741; 235/492
   See application file for complete search history.

(56) References Cited

U.S. PATENT DOCUMENTS 7,275,696 B2 * 10/2007 Akita et al. .................... 235/492
7,830,311 B2 * 11/2010 Kataya et al. .......... 343/700 MS (Continued)

FOREIGN PATENT DOCUMENTS

| EP | 2 012 258 A1 | 1/2009 |
| EP | 2 056 400 A1 | 5/2009 |

(Continued)

OTHER PUBLICATIONS

Official Communication issued in International Patent Application No. PCT/JP2011/051424, mailed on Apr. 26, 2011.
Official Communication issued in corresponding United Kingdom Patent Application No. 1211979.8, mailed on Oct. 31, 2013.

Primary Examiner — Tan Ho
(74) Attorney, Agent, or Firm — Keating & Bennett, LLP (57) ABSTRACT

A composite printed wiring board includes a parent board and a child board that is mounted on the parent board. A wireless IC element that processes a high-frequency signal, a loop-shaped electrode that is coupled to the wireless IC element, and a first radiator that is coupled to the loop-shaped electrode are provided on the child board. A second radiator that is coupled to the loop-shaped electrode via an electromagnetic field is provided on the parent board.

11 Claims, 5 Drawing Sheets

(56) References Cited

U.S. PATENT DOCUMENTS

| | | |
|---|---|---|
| 8,680,971 B2 * | 3/2014 | Ito .................................. 340/10.4 |
| 2009/0021352 A1 | 1/2009 | Kataya et al. |
| 2009/0021446 A1 | 1/2009 | Kataya et al. |
| 2009/0033465 A1 | 2/2009 | Mickle et al. |
| 2009/0160719 A1 | 6/2009 | Kato et al. |
| 2010/0103058 A1 | 4/2010 | Kato et al. |
| 2012/0153029 A1 * | 6/2012 | Kato ............................. 235/492 |
| 2013/0037617 A1 * | 2/2013 | Weakley et al. .............. 235/492 |
| 2014/0203976 A1 * | 7/2014 | Yosui ............................ 343/702 |

FOREIGN PATENT DOCUMENTS

| | | |
|---|---|---|
| JP | 2009-260758 A | 11/2009 |
| WO | 2009/011144 A1 | 1/2009 |
| WO | 2009/011154 A1 | 1/2009 |
| WO | 2009/011423 A1 | 1/2009 |
| WO | 2009/018271 A1 | 2/2009 |
| WO | 2009/142114 A1 | 11/2009 |

* cited by examiner

COMPOSITE PRINTED WIRING BOARD AND WIRELESS COMMUNICATION SYSTEM

BACKGROUND OF THE INVENTION

1. Field of the Invention

The present invention relates to composite printed wiring boards and wireless communication systems, and in particular, to a composite printed wiring board and a wireless communication system that are preferably for use in an RFID (Radio Frequency Identification) system.

2. Description of the Related Art

In recent years, as information management systems for products, RFID systems have been put into practical use in which communication is made, in a non-contact manner utilizing an electromagnetic field, between a reader/writer that generates an induction field and an RFID tag that is added to a product, and specific information is transmitted. The RFID tag includes a wireless IC chip that stores specific information and processes specific wireless signals and an antenna (radiator) that performs transmission and reception of high-frequency signals.

RFID systems may be used for information management of printed wiring boards provided in various electronic apparatuses. For example, an RFID tag that utilizes a ground electrode of a printed wiring board as an antenna is described in PCT International Publication No. WO2009/011144. In the RFID tag, a loop-shaped electrode for achieving impedance matching is provided between a wireless IC chip and a ground electrode. Therefore, an RFID tag that achieves a small signal loss can be implemented with such a simple configuration.

In recent years, due to advanced and multi-functional electronic apparatuses, composite printed wiring boards may be used as printed wiring boards. A composite printed wiring board includes a large-size parent board (main board) and a child board (sub-board) arranged as a specific functional block. The child board is mounted on the parent board. For a composite printed wiring board, by adding an RFID tag to each of the parent board and the child board, information management of the individual boards can be performed. However, a number of RFID tags that correspond to individual boards are required, which results in a complication of a matching circuit and an increase in the size of the individual boards. Furthermore, when the number of RFID tags increases, load, such as signal processing, to be put on the RFID system increases, which results in a complication of the system and an increase in the cost.

SUMMARY OF THE INVENTION

Accordingly, preferred embodiments of the present invention provide a composite printed wiring board and a wireless communication system that have a simple configuration, that achieve an increase in the radiant gain, and that are suitable for an RFID system.

A composite printed wiring board according to a first preferred embodiment of the present invention includes a parent board and a child board that is mounted on the parent board. A wireless IC element that processes a high-frequency signal, a loop-shaped electrode that is coupled to the wireless IC element, and a first radiator that is coupled to the loop-shaped electrode are provided on the child board. A second radiator that is coupled to the loop-shaped electrode via an electromagnetic field is provided on the parent board.

A wireless communication system according to a second preferred embodiment of the present invention includes a composite printed wiring board that includes a parent board and a child board that is mounted on the parent board. A wireless IC element that processes a high-frequency signal, a loop-shaped electrode that is coupled to the wireless IC element, and a first radiator that is coupled to the loop-shaped electrode are provided on the child board. A second radiator that is coupled to the loop-shaped electrode via an electromagnetic field is provided on the parent board.

In the composite printed wiring board, the wireless IC element is coupled to the first radiator via the loop-shaped electrode, and the first radiator functions as an antenna. The wireless IC element is also coupled to the second radiator via the loop-shaped electrode, and the second radiator also functions as an antenna. In this case, the loop-shaped electrode functions as a matching circuit for impedances with respect to the first and second radiators. That is, the wireless IC element is operated via the loop-shaped electrode in accordance with a high-frequency signal that is received at the first radiator and the second radiator, and a response signal from the wireless IC element is radiated via the loop-shaped electrode from the first and second radiators to the outside. Accordingly, management of information on the child board and the parent board can be performed by the wireless IC element, which is provided on the child board. Thus, there is no need to provide a plurality of wireless IC elements. Furthermore, the second radiator on the parent board is used for transmission and reception, thus increasing the radiant gain.

According to various preferred embodiments of the present invention, a composite printed wiring board that has a simple configuration and that achieves an increase in the radiant gain can be suitably used for an RFID system.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A-3D illustrate a child board that forms the composite printed wiring board, wherein

DETAILED DESCRIPTION OF THE PREFERRED EMBODIMENTS

Hereinafter, a composite printed wiring board and a wireless communication system according to preferred embodiments of the present invention will be explained with reference to the attached drawings. Note that in individual drawings, common elements are referred to with the same reference signs and redundant explanation will be omitted.

First Preferred Embodiment

Figure 1:
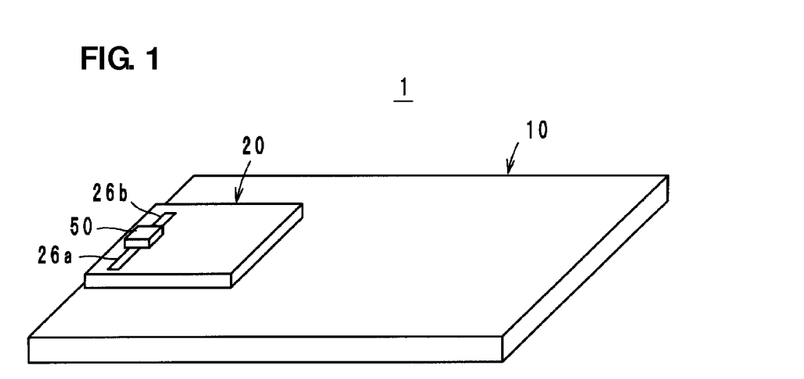
FIG. 1 is a perspective view illustrating a composite printed wiring board according to a first preferred embodiment of the prevent invention.
Figure 2:
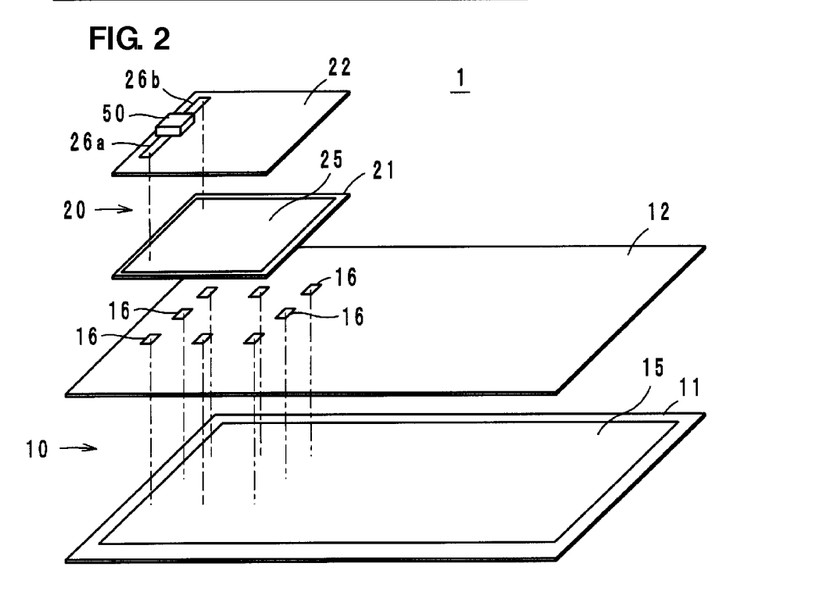
FIG. 2 is an exploded perspective view illustrating the composite printed wiring board.
Figure 3A:
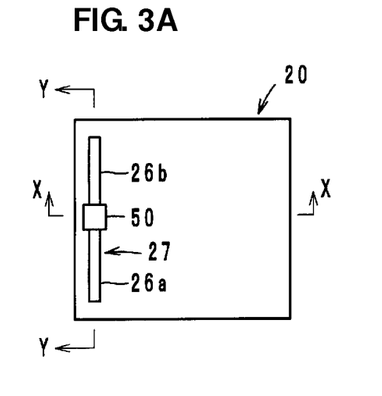
FIG. 3A is a front-side view.
Figure 3B:
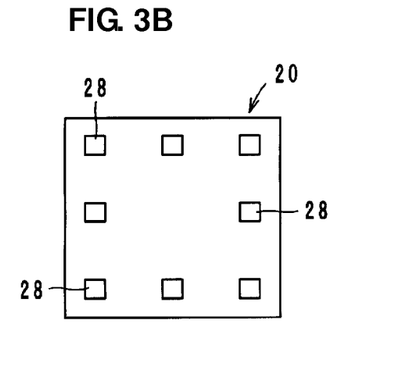
FIG. 3B is a rear-side view.
Figure 3C:
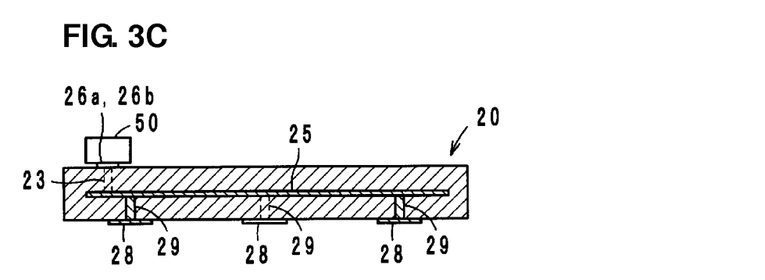
FIG. 3C is an enlarged sectional view taken long X-X.
Figure 3D:
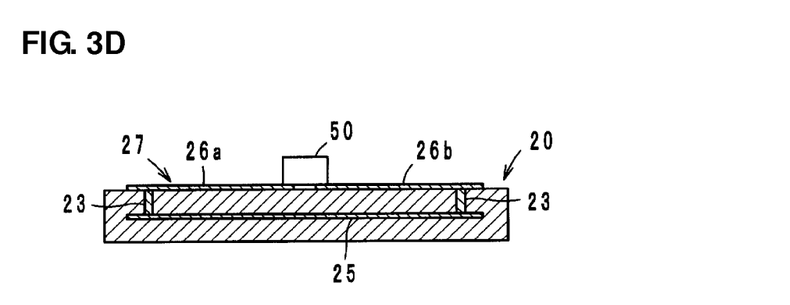
FIG. 3D is an enlarged sectional view taken along Y-Y.

As illustrated in FIGS. 1 and 2, a composite printed wiring board 1 according to a first preferred embodiment includes a parent board 10 that has a relatively large area and a child board 20 that has a relatively small area and that is mounted on the parent board 10. The parent board 10 is a multilayer board that includes a base material layer 11 including a second radiator 15 located on the front surface thereof and a base material layer 12 including a plurality of terminal electrodes 16 located thereon. The child board 20 preferably is a multilayer board that includes a base material layer 21 having a first radiator 25 located on the front surface thereof and a base material layer 22 including planar conductors 26a and 26b located on the front surface thereof. A wireless IC element 50 is mounted on the front surface (on the base material layer 22) of the child board 20. The individual base material layers of the parent board 10 and the child board 20 are each preferably made of a well-known glass epoxy material. The first and second radiators 25 and 15 function as antennas, as explained below. However, the first and second radiators 25 and 15 may function as ground conductors for electronic components (see FIG. 6) mounted on the parent board 10 and the child board 20.

The wireless IC element 50 processes high-frequency signals. The wireless IC element 50 will be explained in detail below with reference to FIGS. 8 to 11.

As illustrated in FIGS. 3A-3D, in the child board 20, one ends of the planar conductors 26a and 26b are electrically connected to a first terminal electrode and a second terminal electrode, which are not illustrated, of the wireless IC element 50. The planar conductors 26a and 26b are electrically connected to the first radiator 25, which is provided inside the child board 20, via inter-layer conductors 23 (via-hole conductors). As most clearly illustrated in the enlarged sectional view taken along Y-Y of FIG. 3D, the planar conductors 26a and 26b, the inter-layer conductors 23, and a portion of the first radiator 25 define a loop-shaped electrode 27. The portion of the first radiator 25 preferably is a conductor portion extending between connection points that are connected with the inter-layer conductors 23. Furthermore, a plurality of terminal electrodes 28 are located on the rear surface of the child board 20. The terminal electrodes 28 are electrically connected to the first radiator 25 via inter-layer conductors 29 (via-hole conductors).

Figure 4:
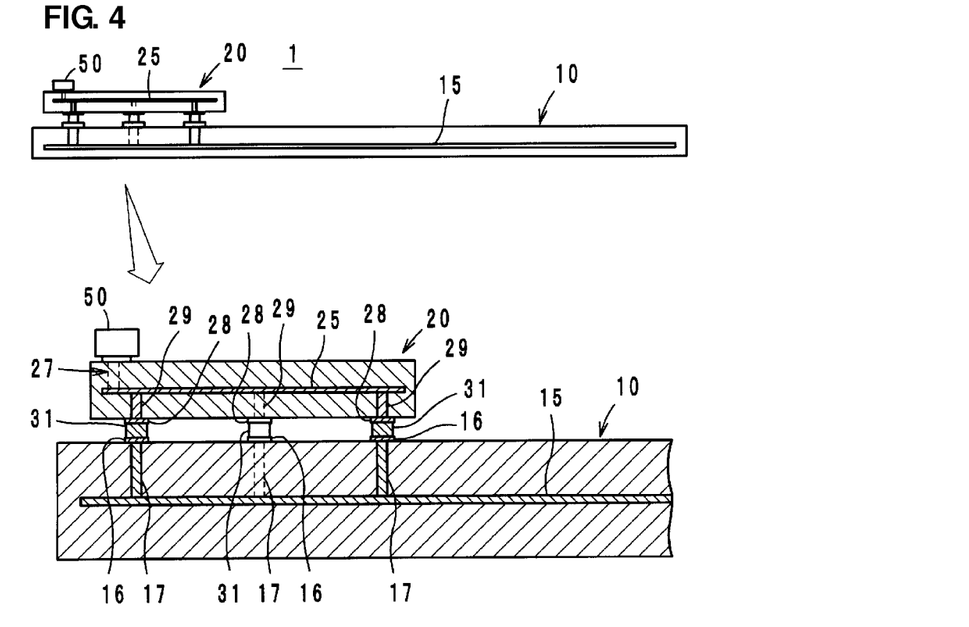
FIG. 4 is a sectional view illustrating the composite printed wiring board.

As illustrated in FIG. 4, a plurality of terminal electrodes 16 that face the terminal electrodes 28 are located on the front surface of the parent board 10. The terminal electrodes 16 are electrically connected to the second radiator via inter-layer conductors 17 (via-hole conductors). The child board 20 is arranged on the parent board 10 in such a manner that the terminal electrodes 28 are electrically connected and fixed to the terminal electrodes 16 by soldering or with bonding materials 31 such as conductive pins.

Figure 5:
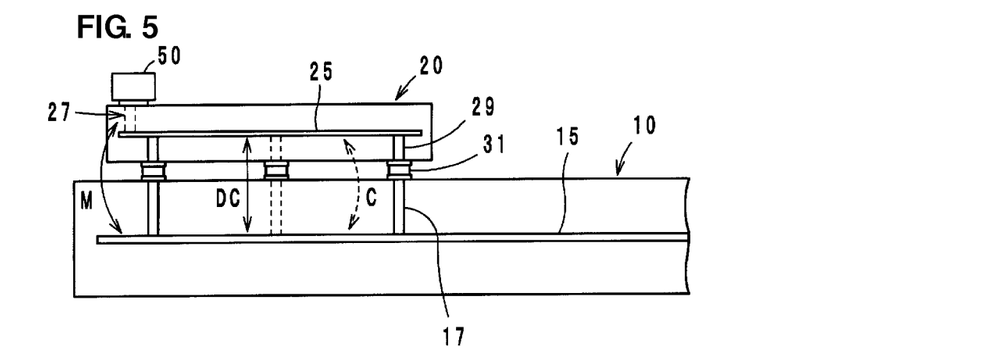
FIG. 5 is an explanatory diagram illustrating the coupling relationship of radiators that are provided on a parent board and a child board.

As illustrated in FIG. 5, the loop-shaped electrode 27 is electrically connected (DC-connected) to the first radiator 25, and is electrically connected (DC-connected) and coupled via an electromagnetic field M to the second radiator 15. Electrical connection between the loop-shaped electrode 27 and the first radiator 25 improves the transmission efficiency of high-frequency signals. By separating the loop-shaped electrode 27 from the first radiator 25, the loop-shaped electrode 27 and the first radiator 25 may be coupled via an electromagnetic field. Similarly, by separating the first radiator 25 from the second radiator 15, the loop-shaped electrode 27 and the second radiator 15 may be coupled only via an electromagnetic field M. That is, main coupling between the loop-shaped electrode 27 and the second radiator is coupling via an electromagnetic field M (this indicates one of or both an electric field and a magnetic field).

The first and second radiators 25 and 15 are electrically connected (DC-connected) via the inter-layer conductors 17 and 29 and the bonding materials 31. However, the first and second radiators 25 and 15 may not be electrically connected. In this case, the first and second radiators 25 and 15 are electromagnetic-field-coupled mainly via a capacitance C. Accordingly, due to electrical connection or electromagnetic-field-coupling between the first and second radiators 25 and 15, the transmission efficiency of high-frequency signals between the loop-shaped electrode 27 and the second radiator 15 can be increased.

In the composite printed wiring board 1 having the configuration described above, since the loop-shaped electrode is coupled to the first and second radiators 25 and 15, a high-frequency signal radiated from the reader/writer of the RFID system and received at the first and second radiators 25 and 15 is supplied via the loop-shaped electrode 27 to the wireless IC element 50, and the wireless IC element 50 is operated. Meanwhile, a response signal from the wireless IC element 50 is transmitted via the loop-shaped electrode 27 to the first and second radiators 25 and 15, and is radiated to the reader/writer.

The loop-shaped electrode 27 allows coupling between the wireless IC element 50 and the first radiator 25 and functions as an impedance matching circuit. The loop-shaped electrode 27 also allows coupling between the wireless IC element 50 and the second radiator 15 and functions as an impedance matching circuit. By adjusting the electric length and electrode width of the loop-shaped electrode 27, the loop-shaped electrode 27 is capable of achieving impedance matching. The loop surface of the loop-shaped electrode 27 (illustrated in FIG. 3(D)) is preferably arranged vertically with respect to the first and second radiators 25 and 15. Alternatively, the loop surface may be formed so as to be positioned horizontally with respect to the first and second radiators 25 and 15. That is, a loop-shaped electrode may be located on the front surface of a base material layer.

In the composite printed wiring board 1, the child board 20, on which the wireless IC element 50 and the loop-shaped electrode 27 are provided, is mounted on the parent board 10. Thus, management of information on the child board 20 and the parent board 10 can be performed by the single wireless IC element 50. Therefore, there is no need to provide and arrange a plurality of wireless IC elements 50. Furthermore, since the second radiator 15 of the parent board 10, as well as the first radiator 25 of the child board 20, is used for transmission and reception, the area of radiators increases, resulting in an increase in the radiant gain.

Furthermore, since the loop-shaped electrode 27 is preferably arranged so as to be positioned at an end portion (or may be positioned in the vicinity of the end portion) of the second radiator 15, the transmission efficiency of a high-frequency signal between the loop-shaped electrode 27 and the second radiator 15 can be increased. Furthermore, since the first radiator 25 and the second radiator 15 are electrically connected and thermally connected via the inter-layer conductors 17 and 29 and the bonding materials 31, the heat of the child board 20 having a small area can be efficiently radiated by the parent board 10 having a large area.

Figure 6:
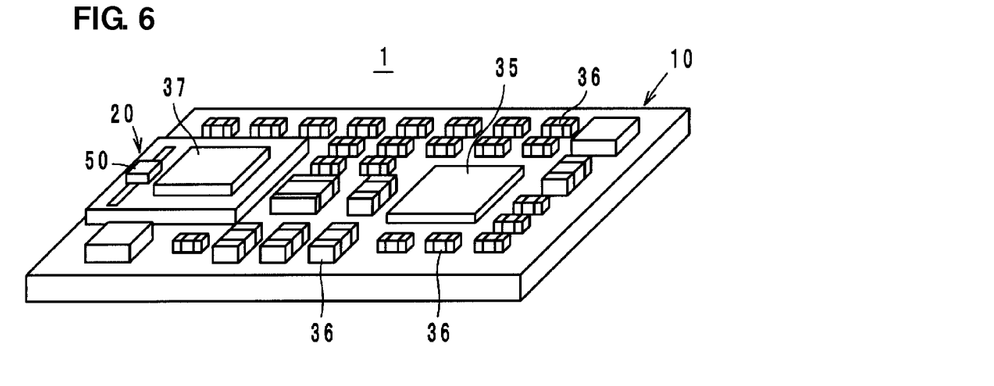
FIG. 6 is a perspective view illustrating the state where various electronic components are mounted on the composite printed wiring board.

Various electronic components are mounted on the composite printed wiring board and are provided inside an electronic apparatus such as a computer. Such an example is illustrated in FIG. 6. An IC circuit component 35 and many chip-type electronic components 36 are mounted on the parent board 10. An IC circuit component 37 is mounted on the child board 20.

Figure 7:
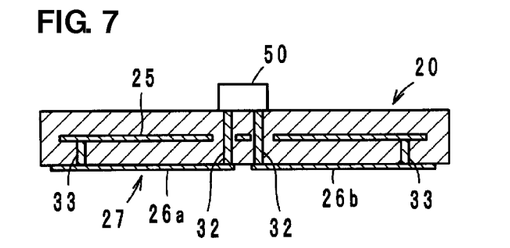
FIG. 7 is a sectional view illustrating a variation of a child board.

FIG. 7 illustrates a variation of the child board 20, in which the planar conductors 26a and 26b defining the loop-shaped electrode 27 are located on the rear surface of the child board 20. That is, the planar conductors 26a and 26b located on the rear surface are electrically connected to the first and second terminal electrodes of the wireless IC element 50 via inter-layer conductors 32 (via-hole conductors) and are electrically connected to the first radiator 25 via inter-layer conductors 33 (via-hole conductors). Although not illustrated in FIG. 7, the first radiator 25 is coupled to the second radiator 15 in a configuration similar to that illustrated in FIG. 4.

In the child board 20 illustrated in FIG. 7, the planar conductors 26a and 26b are provided on a layer that is different from the layer on which the wireless IC element 50 is provided. Thus, the front surface of the child board 20 can be efficiently used as a surface on which a different element is provided.

Figure 8:
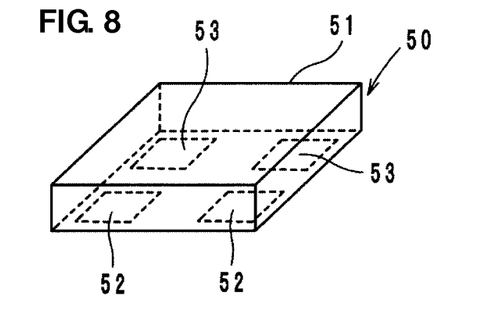
FIG. 8 is a perspective view illustrating a wireless IC chip that serves as a wireless IC element.

As illustrated in FIG. 8, the wireless IC element 50 may be a wireless IC chip 51 that processes high-frequency signals. Alternatively, as illustrated in FIG. 9, the wireless IC element 50 may include the wireless IC chip 51 and a feeder circuit board 65 that includes a resonant circuit having a specific resonant frequency.

The wireless IC chip 51 illustrated in FIG. 8 preferably includes a clock circuit, a logic circuit, a memory circuit, and the like, and necessary information is stored in the wireless IC chip 51. Input/output terminal electrodes 52 and mounted terminal electrodes 53 are provided on the rear surface of the wireless IC chip 51. The input/output terminal electrodes 52 correspond to the first and second terminal electrodes in the first preferred embodiment. The input/out terminal electrodes 52 are electrically connected to the planar conductors 26a and 26b via metal bumps or other suitable connection member or material. Au, solder, or the like may be used as a material of a metal bump, for example.

Figure 9:
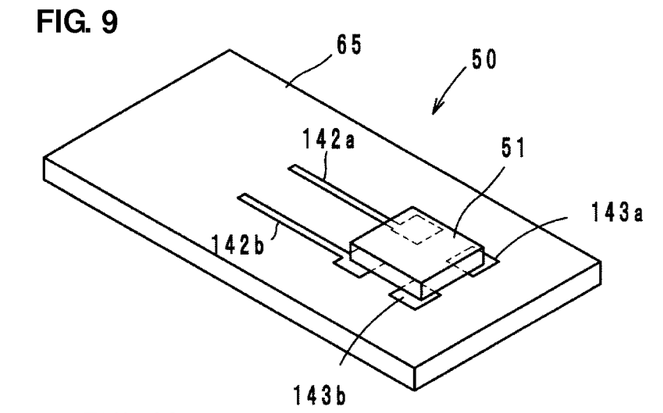
FIG. 9 is a perspective view illustrating the state where the wireless IC chip is mounted as a wireless IC element on a feeder circuit board.

In the case where the wireless IC chip 51 and the feeder circuit board 65 define the wireless IC element 50 as illustrated in FIG. 9, various feeder circuits (including a resonant circuit/matching circuit) may be provided on the feeder circuit board 65. For example, as illustrated as an equivalent circuit in FIG. 10, a feeder circuit 66 including inductance elements L1 and L2 that have different inductances and that are magnetically coupled in opposite phases (illustrated as a mutual inductance M) may be provided. The feeder circuit 66 has a specific resonant frequency and achieves impedance matching between the wireless IC chip 51 and the first and second radiators 25 and 15. The wireless IC chip 51 may be electrically connected (DC-connected) or coupled via an electromagnetic field to the feeder circuit 66.

Figure 10:
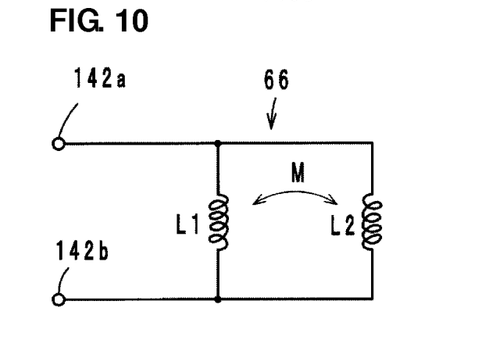
FIG. 10 is an equivalent circuit diagram illustrating an example of a feeder circuit.

The feeder circuit 66 transmits a high-frequency signal that has been transmitted from the wireless IC chip 51 and that has a specific frequency via the loop-shaped electrode to the first and second radiators 25 and 15. The feeder circuit 66 also supplies a high-frequency signal received at the first and second radiators 25 and 15 via the loop-shaped electrode 27 to the wireless IC chip 51. Since the feeder circuit 66 has a specific resonant frequency, impedance matching with the first and second radiators 25 and 15 can be easily achieved. Thus, the electrical length of the loop-shaped electrode 27 can be reduced.

The configuration of the feeder circuit board 65 will now be explained. As illustrated in FIGS. 8 and 9, the input/output terminal electrodes 52 of the wireless IC chip 51 are connected via metal bumps or the like to feeder terminal electrodes 142a and 142b located on the feeder circuit board 65, and the mounted terminal electrodes 53 are connected via metal bumps or the like to mounted terminal electrodes 143a and 143b.

Figure 11:
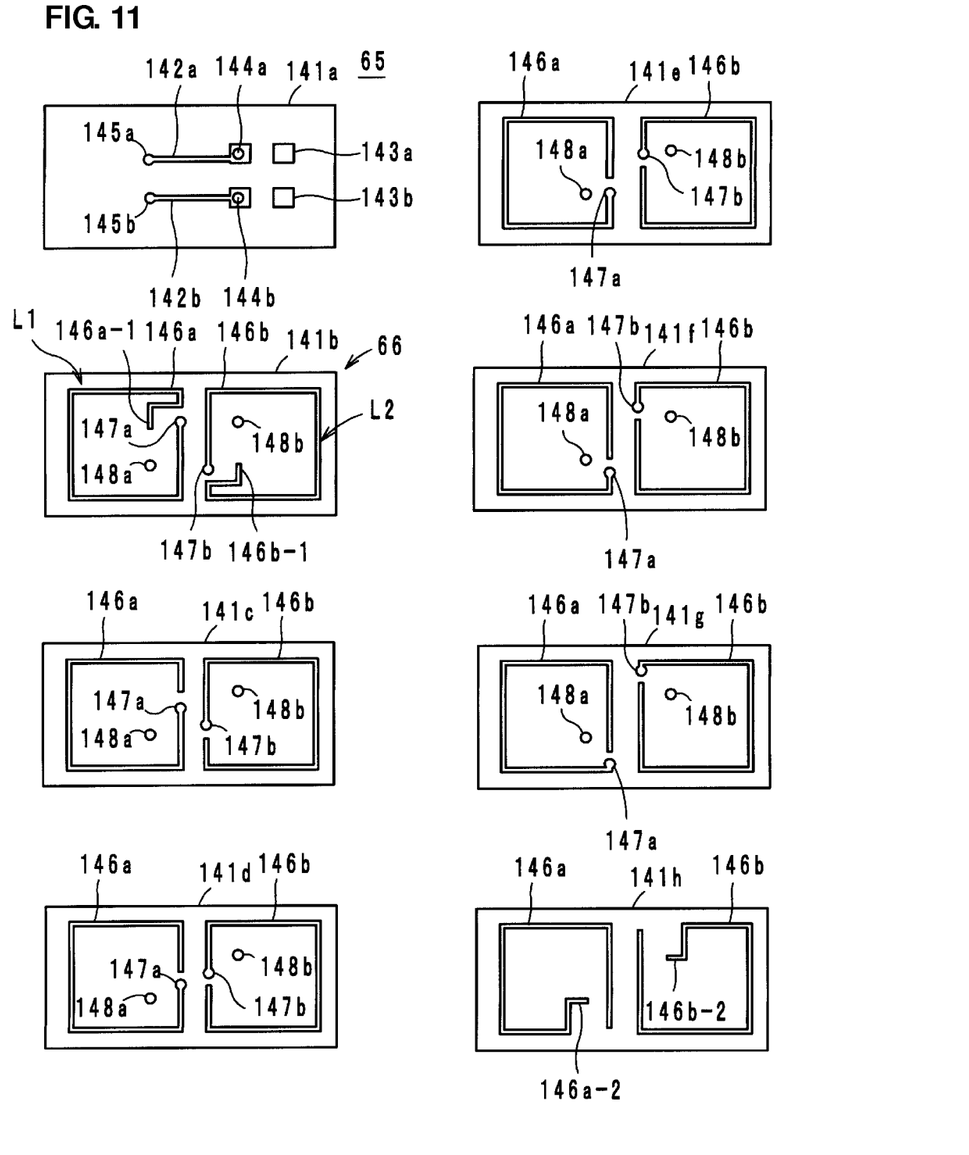
FIG. 11 is a plan view illustrating a laminated structure of the feeder circuit board.

As illustrated in FIG. 11, the feeder circuit board 65 is preferably formed by laminating, press-bonding, and burning ceramic sheets 141a to 141h made of dielectric or magnetic materials. However, an insulating layer defining the feeder circuit board 65 is not limited to a ceramic sheet. The insulating layer may be, for example, a resin sheet made of a thermosetting resin or a thermoplastic resin such as a liquid crystal polymer. The feeder terminal electrodes 142a and 142b, the mounted terminal electrodes 143a and 143b, via-hole conductors 144a, 144b, 145a, and 145b are located on the sheet 141a, which is the uppermost layer. Wiring electrodes 146a and 146b defining the inductance elements L1 and L2 are located on each of the sheets 141b to 141h, which are the second to eighth sheets from the top. According to need, via-hole conductors 147a, 147b, 148a, and 148b are also located on the individual sheets 141b to 141h.

By laminating the above-described sheets 141a to 141h, the inductance element L1 in which the wiring electrodes 146a are connected in a spiral shape via the via-hole conductors 147a is provided, and the inductance element L2 in which the wiring electrodes 146b are connected in a spiral shape via the via-hole conductors 147b is provided. Furthermore, capacitances are provided between the wiring electrodes 146a and 146b.

An end portion 146a-1 of the wiring electrode 146a on the sheet 141b is connected via the via-hole conductor 145a to the feeder terminal electrode 142a, and an end portion 146a-2 of the wiring electrode 146a on the sheet 141h is connected via the via-hole conductors 148a and 145b to the feeder terminal electrode 142b. An end portion 146b-1 of the wiring electrode 146b on the sheet 141b is connected via the via-hole conductor 144b to the feeder terminal electrode 142b, and an end portion 146b-2 of the wiring electrode 146b on the sheet 141h is connected via the via-hole conductors 148b and 144a to the feeder terminal electrode 142a.

In the feeder circuit 66 described above, since the inductance elements L1 and L2 are wound in opposite directions, magnetic fields generated by the inductance elements L1 and L2 are canceled. Because of the cancellation of the magnetic fields, in order to achieve a desired inductance, the length of the wiring electrodes 146a and 146b needs to be increased to some extent. Thus, since the Q factor is decreased, the sharpness of the resonance characteristics is lost, and a wider bandwidth can be achieved near the resonant frequency.

When the feeder circuit board 65 is viewed in plan perspective, the inductance elements L1 and L2 are located in horizontally different positions. Furthermore, magnetic fields generated by the inductance elements L1 and L2 are in opposite directions. Thus, when the feeder circuit 66 is coupled to the loop-shaped electrode 27, currents in different directions are excited in the loop-shaped electrode 27, and currents can be generated in the first and second radiators 25 and 15. Accordingly, the first and second radiators 25 and 15 can be operated as antennas on the basis of a potential difference of the currents.

By providing a resonant/matching circuit in the feeder circuit board 65, variations in the characteristics caused by the influence of external products can be reduced, thus avoiding the degradation of the communication quality. Furthermore, when the wireless IC chip 51 defining the wireless IC element 50 is directed toward the center in the thickness direction of the feeder circuit board 65, the wireless IC chip 51 is prevented from being destroyed or damaged, thus improving the mechanical strength of the wireless IC element 50.

OTHER PREFERRED EMBODIMENTS

A composite printed wiring board and a wireless communication system according to the present invention is not limited to the foregoing preferred embodiments. Various changes can be made within the scope of the gist of the present invention.

For example, first and/or second radiators may be provided over two layers of a child board and a parent board. Alternatively, the first and/or second radiators may be provided on the front surface of the child board and the parent board, and may have any shapes.

As described above, preferred embodiments of the present invention are useful for a composite printed wiring board and a wireless communication system. In particular, preferred embodiments of the present invention are excellent in its simple configuration and an increased radiant gain.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite printed wiring board comprising:
   a parent board; and
   a child board that is mounted on the parent board; wherein
   a wireless IC element that processes a high-frequency signal, a loop-shaped electrode that is coupled to the wireless IC element, and a first radiator that is coupled to the loop-shaped electrode are provided on the child board; and
   a second radiator that is coupled to the loop-shaped electrode via an electromagnetic field is provided on the parent board.

2. The composite printed wiring board according to claim 1, wherein the first radiator is a ground conductor.

3. The composite printed wiring board according to claim 1, wherein the second radiator is a ground conductor.

4. The composite printed wiring board according to claim 1, wherein the loop-shaped electrode is electrically connected to the first radiator.

5. The composite printed wiring board according to claim 1, wherein the first radiator and the second radiator are electrically connected to each other.

6. The composite printed wiring board according to claim 1, wherein the loop-shaped electrode is positioned at an end portion or in a vicinity of the end portion of the second radiator.

7. The composite printed wiring board according to claim 1, wherein
   the child board includes a multilayer board;
   the wireless IC element and the first radiator are provided on different layers of the multilayer board; and
   the loop-shaped electrode includes:
   a first planar conductor that is provided on the layer on which the wireless IC element is provided and that is electrically connected to a first terminal of the wireless IC element;
   a first inter-layer conductor that allows electrical connection between the first planar conductor and the first radiator;
   a second planar conductor that is provided on the layer on which the wireless IC element is provided and that is electrically connected to a second terminal of the wireless IC element;
   a second inter-layer conductor that allows electrical connection between the second planar conductor and the first radiator; and
   a conductor portion that extends between a connection point of the first radiator that is connected with the first inter-layer conductor and a connection point of the first radiator that is connected with the second inter-layer conductor.

8. The composite printed wiring board according to claim 1, wherein
   the child board includes a multilayer board;
   the wireless IC element and the first radiator are provided on different layers of the multilayer board;
   the loop-shaped electrode includes:
   a third planar conductor that is provided on a layer different from the layer on which the wireless IC element is provided and that is electrically connected to a first terminal of the wireless IC element via a third inter-layer conductor;
   a fourth inter-layer conductor that allows electrical connection between the third planar conductor and the first radiator;
   a fourth planar conductor that is provided on the layer different from the layer on which the wireless IC element is provided and that is electrically connected to a second terminal of the wireless IC element via a fifth inter-layer conductor;
   a sixth inter-layer conductor that allows electrical connection between the fourth planar conductor and the first radiator; and
   a conductor portion that extends between a connection point of the first radiator that is connected with the fourth inter-layer conductor and a connection point of the first radiator that is connected with the sixth inter-layer conductor.

9. The composite printed wiring board according to claim 1, wherein the wireless IC element includes a wireless IC chip that processes a high-frequency signal.

10. The composite printed wiring board according to claim 1, wherein the wireless IC element includes a wireless IC chip that processes a high-frequency signal and a feeder circuit board that includes a feeder circuit having a specific resonant frequency.

11. A wireless communication system comprising:
    a composite printed wiring board that includes a parent board and a child board that is mounted on the parent board; wherein
    a wireless IC element that processes a high-frequency signal, a loop-shaped electrode that is coupled to the wireless IC element, and a first radiator that is coupled to the loop-shaped electrode are provided on the child board; and
    a second radiator that is coupled to the loop-shaped electrode via an electromagnetic field is provided on the parent board.

* * * * *